United States Patent
Bang et al.

(10) Patent No.: US 11,545,533 B2
(45) Date of Patent: Jan. 3, 2023

(54) DISPLAY APPARATUS

(71) Applicant: SAMSUNG DISPLAY CO., LTD., Yongin-si (KR)

(72) Inventors: Jinsook Bang, Hwaseong-si (KR); Sang Hoon Yim, Suwon-si (KR); Dong Hoon Kim, Suwon-si (KR); Jin Wook Jeong, Asan-si (KR); Jinyoung Choi, Hwaseong-si (KR); Eunjeong Hong, Seoul (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 232 days.

(21) Appl. No.: 16/899,789

(22) Filed: Jun. 12, 2020

(65) Prior Publication Data

US 2021/0083034 A1   Mar. 18, 2021

(30) Foreign Application Priority Data

Sep. 18, 2019 (KR) .................. 10-2019-0114783

(51) Int. Cl.
*H01L 27/32* (2006.01)
*H01L 51/50* (2006.01)

(52) U.S. Cl.
CPC ...... *H01L 27/3276* (2013.01); *H01L 27/3223* (2013.01); *H01L 51/5012* (2013.01); *H01L 2251/558* (2013.01)

(58) Field of Classification Search
CPC . H01L 27/3276; H01L 27/3211; H01L 27/124
See application file for complete search history.

(56) References Cited

U.S. PATENT DOCUMENTS

2008/0157081 A1* 7/2008 Huh .................... H01L 27/1214
438/164

FOREIGN PATENT DOCUMENTS

| JP | 2004-191627 | 7/2004 |
| JP | 3580092 | 7/2004 |
| KR | 10-1657357 | 9/2016 |

* cited by examiner

*Primary Examiner* — Fernando L Toledo
*Assistant Examiner* — Valerie N Newton
(74) *Attorney, Agent, or Firm* — F. Chau & Associates, LLC

(57) ABSTRACT

A display apparatus includes: a base substrate; a thin film transistor disposed on the base substrate and including an active pattern; an insulating layer disposed on the active pattern of the thin film transistor; a connection electrode disposed on the insulating layer, and electrically connected to the thin film transistor, wherein the connection electrode includes a curved wiring portion; a first via insulating layer covering the connection electrode; a first electrode disposed on the first via insulating layer; a light emitting layer disposed on the first electrode and at least partially overlapping the connection electrode; and a second electrode disposed on the light emitting layer.

20 Claims, 10 Drawing Sheets

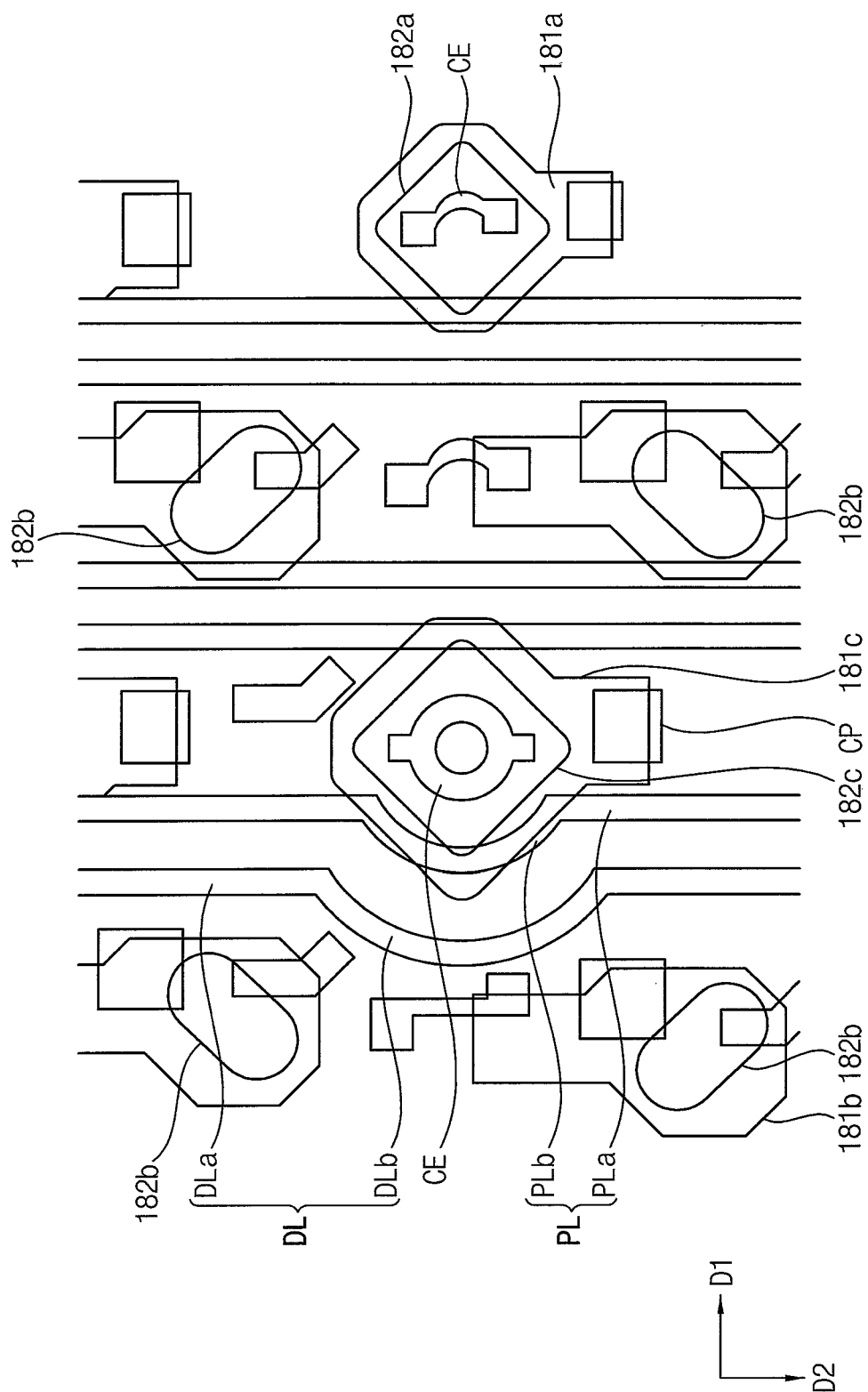

DISPLAY APPARATUS

CROSS-REFERENCE TO RELATED APPLICATION

This application claims priority under 35 USC § 119 to Korean Patent Application No. 10-2019-0114783 filed on Sep. 18, 2019 in the Korean Intellectual Property Office (KIPO), the disclosure of which is incorporated by reference herein in its entirety.

TECHNICAL FIELD

Exemplary embodiments of the present inventive concept relate generally to a display apparatus. More particularly, exemplary embodiments of the present inventive concept relate to a display apparatus having a connection electrode.

DISCUSSION OF THE RELATED ART

As the technology improves, display products having smaller sizes, lighter weights, and superior performance are being produced. Conventional cathode ray tube (CRT) televisions have been widely used for display apparatuses because of their performance and price. Recently, however, a display apparatus such as a plasma display apparatus, a liquid crystal display apparatus, and an organic light emitting diode display apparatus have been increasingly used because, when compared to a CRT, these display apparatuses provide increased miniaturization or portability, are light in weight, and have relatively low power consumption.

The organic light emitting diode display apparatus typically includes a substrate, a plurality of wirings disposed on the substrate, and a light emitting structure disposed on the wirings.

SUMMARY

According to an exemplary embodiment of the present inventive concept, a display apparatus includes: a base substrate; a thin film transistor disposed on the base substrate and including an active pattern; an insulating layer disposed on the active pattern of the thin film transistor; a connection electrode disposed on the insulating layer, and electrically connected to the thin film transistor, wherein the connection electrode includes a curved wiring portion; a first via insulating layer covering the connection electrode; a first electrode disposed on the first via insulating layer, a light emitting layer disposed on the first electrode and at least partially overlapping the connection electrode; and a second electrode disposed on the light emitting layer.

In an exemplary embodiment of the present inventive concept, the display apparatus further includes: a plurality of data lines arranged along a first direction, wherein each of the data lines extend in a second direction crossing the first direction, wherein the connection electrode includes a first contact portion, a second contact portion spaced apart from the first contact portion in the second direction, and the curved wiring portion which connects the first contact portion to the second contact portion.

In an exemplary embodiment of the present inventive concept, a data line, of the plurality of data lines, adjacent to the connection electrode includes a straight line portion and a curved line portion connected to the straight line portion, wherein the curved line portion is adjacent to the curved wiring portion of the connection electrode.

In an exemplary embodiment of the present inventive concept, the light emitting layer includes a blue light emitting layer configured to emit blue light.

In an exemplary embodiment of the present inventive concept, the display apparatus further includes: a red light emitting layer spaced apart from the blue light emitting layer and configured to emit red light; and a green light emitting layer spaced apart from the blue light emitting layer and the red light emitting layer and configured to emit green light, wherein a thickness of the blue light emitting layer is smaller than a thickness of each of the red and green light emitting layers.

In an exemplary embodiment of the present inventive concept, the display apparatus further includes: a plurality of power lines arranged along a first direction, wherein each of the power lines extend in a second direction crossing the first direction, wherein the connection electrode includes a first contact portion, a second contact portion spaced apart from the first contact portion in the second direction, and the curved wiring portion which connects the first contact portion to the second contact portion, and wherein a power line, of the plurality of power lines, adjacent to the connection electrode includes a straight line portion and a curved line portion connected to the straight line portion, wherein the curved line portion is adjacent to the curved wiring portion of the connection electrode.

In an exemplary embodiment of the present inventive concept, the connection electrode includes a first contact portion, a second contact portion spaced apart from the first contact portion, and the curved wiring portion connecting the first contact portion to the second contact portion, and wherein the curved wiring portion has an annular shape.

In an exemplary embodiment of the present inventive concept, the curved wiring portion overlaps the light emitting layer.

In an exemplary embodiment of the present inventive concept, the connection electrode includes a first contact portion, a second contact portion spaced apart from the first contact portion, and the curved wiring portion connecting the first contact portion to the second contact portion, and wherein the curved wiring portion has a curved shape.

In an exemplary embodiment of the present inventive concept, the display apparatus further includes: source and drain electrodes disposed between the base substrate and the connection electrode; and a second via insulating layer disposed between the source and drain electrodes and the connection electrode, wherein the connection electrode is electrically connected to the drain electrode through a contact hole formed through the second via insulating layer.

In an exemplary embodiment of the present inventive concept, the connection electrode includes a contact portion and the curved wiring portion connected to the contact portion, and wherein the contact portion of the connection electrode is electrically connected to the first electrode through a contact hole formed through the first via insulating layer.

In an exemplary embodiment of the present inventive concept, the curved wiring portion of the connection electrode has an annular shape, and wherein the curved wiring portion overlaps the light emitting layer.

In an exemplary embodiment of the present inventive concept, the curved wiring portion of the connection electrode has a curved shape, and wherein the curved wiring portion overlaps the light emitting layer.

In an exemplary embodiment of the present inventive concept, the connection electrode includes a first contact portion, a second contact portion spaced apart from the first contact portion, and the curved wiring portion which connects the first contact portion to the second contact portion, and wherein each of the first contact portion and the second contact portion is electrically connected to a conductive pattern of another layer through a contact hole formed through the second via insulating layer.

In an exemplary embodiment of the present inventive concept, a concavo-convex portion corresponding to the connection electrode is formed on a top surface of the first via insulating layer.

In an exemplary embodiment of the present inventive concept, a concavo-convex portion corresponding to the concavo-convex portion of the first via insulating layer is formed on a top surface of the first electrode.

According to an exemplary embodiment of the present inventive concept, a display apparatus includes: a base substrate; a thin film transistor disposed on the base substrate and including an active pattern; an insulating layer disposed on the active pattern of the thin film transistor; a connection electrode disposed on the insulating layer, and electrically connected to the thin film transistor, wherein the connection electrode includes a dummy portion including a horizontal portion extending in a first direction; a via insulating layer covering the connection electrode; a first electrode disposed on the via insulating layer; a light emitting layer disposed on the first electrode and overlapping the dummy portion of the connection electrode; and a second electrode disposed on the light emitting layer.

In an exemplary embodiment of the present inventive concept, the dummy portion further includes a vertical portion extending in a second direction substantially perpendicular to the first direction.

In an exemplary embodiment of the present inventive concept, the connection electrode further includes a first contact portion, a second contact portion spaced apart from the first contact portion in a second direction, and a connection wiring portion connecting the first contact portion to the second contact portion, and wherein the dummy portion extends from the first contact portion, the second contact portion, or the connection wiring portion, and wherein the dummy portion overlaps the light emitting layer.

In an exemplary embodiment of the present inventive concept, the light emitting layer is a blue light emitting layer configured to emit blue light, wherein the display apparatus further includes: a red light emitting layer spaced apart from the blue light emitting layer and configured to emit red light, and a green light emitting layer spaced apart from the blue light emitting layer and the red light emitting layer and configured to emit green light, and wherein a thickness of the blue light emitting layer is smaller than a thickness of each of the red and green light emitting layers.

BRIEF DESCRIPTION OF THE DRAWINGS

The above and other features of the present inventive concept will become more apparent by describing in detailed exemplary embodiments thereof with reference to the accompanying drawings, in which:

FIG. 4 is a plan diagram illustrating a source-drain conductive layer, a pixel electrode, and a light emitting layer of the display apparatus of FIG. 3;

DETAILED DESCRIPTION OF THE EMBODIMENTS

Hereinafter, exemplary embodiments of the present inventive concept will be explained in detail with reference to the accompanying drawings.

Figure 1:
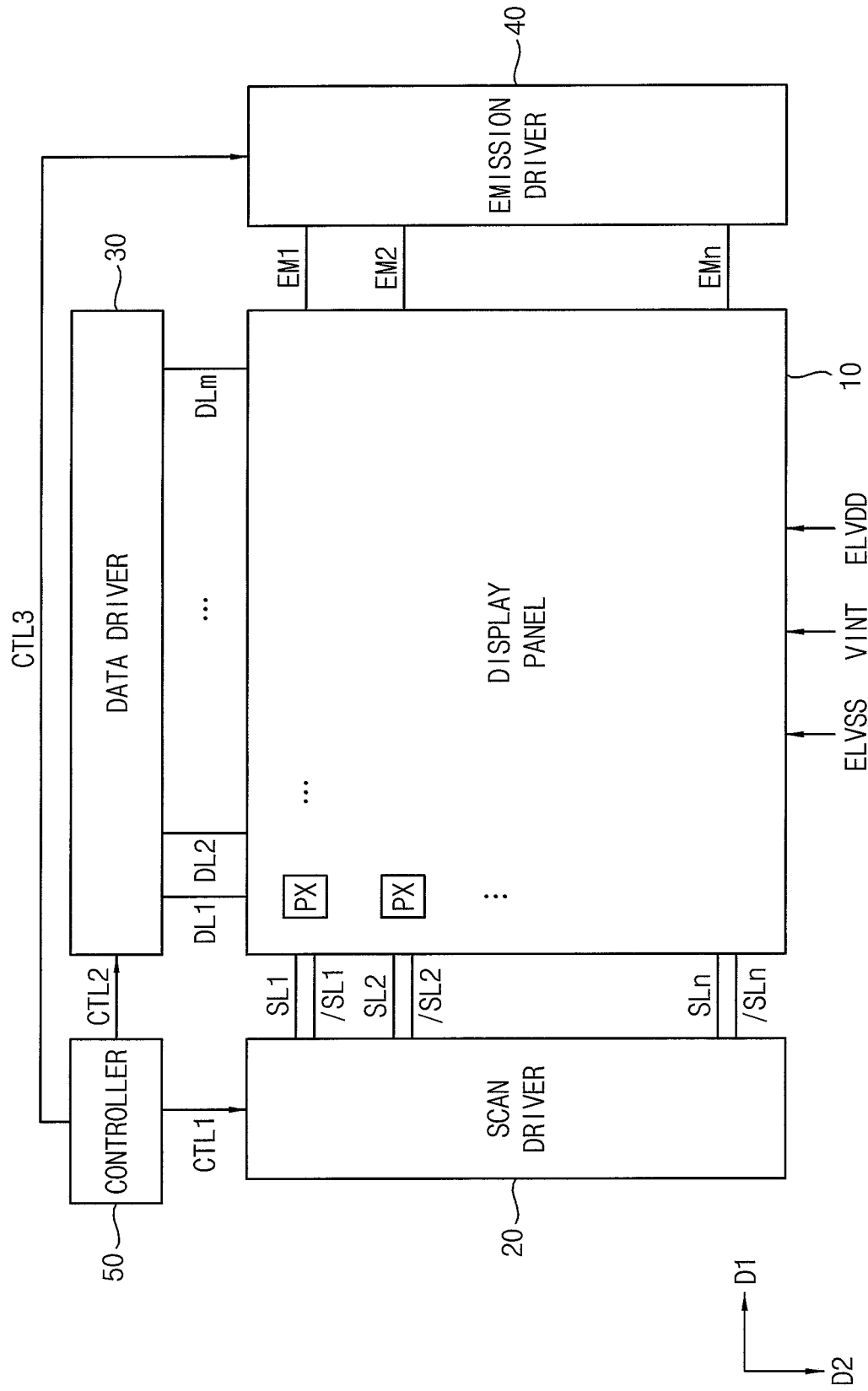
FIG. 1 is a block diagram illustrating a display apparatus according to an exemplary embodiment of the present inventive concept.

FIG. 1 is a block diagram illustrating a display apparatus according to an exemplary embodiment of the present inventive concept.

Referring to FIG. 1, the display apparatus may include a display panel 10, a scan driver 20, a data driver 30, an emission control driver 40, and a controller 50.

The display panel 10 may include a plurality of pixels PX for displaying an image. For example, the display panel 10 may include n×m pixels PX located at intersecting portions between scan lines SL1 to SLn and data lines DL1 to DLm (e.g., where n and m are integers greater than 1, respectively). The structure of the pixel PX will be described in detail with reference to FIG. 2.

The scan driver 20 may sequentially provide a first scan signal to the pixels PX through the scan lines SL1 to SLn, and may sequentially provide a second scan signal to the pixels PX through inverted scan lines /SL1 to /SLn based on a first control signal CTL1. For example, the second scan signal may be an inverted signal of the first scan signal.

The data driver 30 may provide a data signal to the pixels PX through the data lines DL1 to DLm based on a second control signal CTL2.

The emission control driver 40 may sequentially provide an emission control signal to the pixels PX through emission control lines EM1 to EMn based on a third control signal CTL3.

The controller 50 may control the scan driver 20, the data driver 30, and the emission control driver 40. The controller 50 may generate the control signals CTL1 to CTL3 to control the scan driver 20, the data driver 30, and the emission control driver 40, respectively. For example, the first control signal CTL1 for controlling the scan driver 20 may include a scan start signal, a scan clock signal, and the like. For example, the second control signal CTL2 for controlling the data driver 30 may include image data, a horizontal start signal, and the like. For example, the third control signal CTL3 for controlling the emission control driver 40 may include an emission control start signal, an emission control clock signal, and the like.

In addition, the display apparatus may further include a power supply unit configured to supply a first power supply voltage ELVDD, a second power supply voltage ELVSS, and an initialization voltage VINT to the display panel 10.

Figure 2:
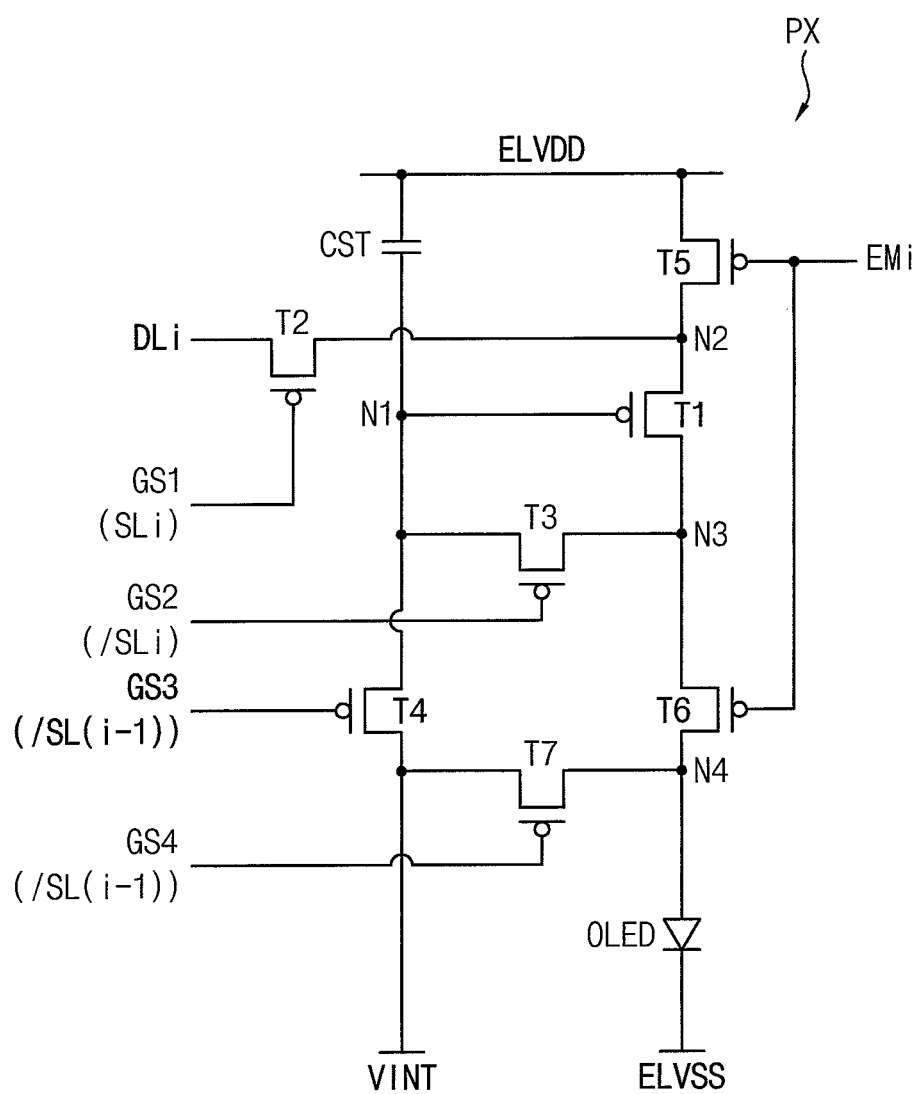
FIG. 2 is a circuit diagram illustrating an example of a pixel included in the display apparatus of FIG. 1.

FIG. 2 is a circuit diagram illustrating an example of a pixel included in the display apparatus of FIG. 1.

Referring to FIG. 2, the pixel PX may include first to seventh transistors T1 to T7, a storage capacitor CST, and an organic light emitting diode OLED. The pixel PX may be located in an $i^{th}$ pixel row (e.g., where i is an integer between 1 and n) and a $j^{th}$ pixel column (e.g., where j is an integer between 1 and m).

The first transistor T1 may be a driving transistor configured to provide a driving current, which corresponds to the received data signal, to the organic light emitting diode OLED. The first transistor T1 may include a gate electrode connected to a first node N1, a first electrode connected to a second node N2, and a second electrode connected to a third node N3.

The second transistor T2 may provide the data signal to the first transistor T1 in response to a first scan signal GS1. In an exemplary embodiment of the present inventive concept, the second transistor T2 may include a gate electrode configured to receive the first scan signal GS1 from an $i^{th}$ scan line SLi, a first electrode configured to receive the data signal from a $j^{th}$ data line DLj, and a second electrode connected to the first electrode of the first transistor T1. For example, the second electrode of the second transistor T2 may be connected to the second node N2.

The third transistor T3 may connect the second electrode of the first transistor T1 to the gate electrode of the first transistor T1 in response to a second scan signal GS2. In an exemplary embodiment of the present inventive concept, the third transistor T3 may include a gate electrode configured to receive the second scan signal GS2 from an $i^{th}$ inverted scan line /SL1, a first electrode connected to the second electrode of the first transistor T1, and a second electrode connected to the gate electrode of the first transistor T1. For example, the first electrode of the third transistor T3 may be connected to the third node N3. For example, the second electrode of the third transistor T3 may be connected to the first node N1.

The fourth transistor T4 may apply the initialization voltage VINT to the gate electrode of the first transistor T1 in response to a third scan signal GS3. In an exemplary embodiment of the present inventive concept, the fourth transistor T4 may include a gate electrode, a first electrode connected to the initialization voltage VINT, and a second electrode connected to the gate electrode of the first transistor T1 at the first node N1. The gate electrode of the fourth transistor T4 is configured to receive the third scan signal GS3 from an $(i-1)^{th}$ inverted scan line /SL(i-1).

The fifth transistor T5 may apply the first power supply voltage ELVDD to the first electrode of the first transistor T1 in response to the emission control signal. In an exemplary embodiment of the present inventive concept, the fifth transistor T5 may include a gate electrode, a first electrode connected to the first power supply voltage ELVDD, and a second electrode connected to the first electrode of the first transistor T1 at the second node N2. The gate electrode of the fifth transistor T5 is configured to receive the emission control signal from an $i^{th}$ emission control line Emi.

The sixth transistor T6 may connect the second electrode of the first transistor T1 to a first electrode of the organic light emitting diode OLED in response to the emission control signal. In an exemplary embodiment of the present inventive concept, the sixth transistor T6 may include a gate electrode, a first electrode connected to the second electrode of the first transistor T1 at the second node N2, and a second electrode connected to the first electrode of the organic light emitting diode OLED at a fourth node N4. The gate electrode of the sixth transistor T6 is configured to receive the emission control signal from the $i^{th}$ emission control line Emi.

The seventh transistor T7 may apply the initialization voltage VINT to the first electrode of the organic light emitting diode OLED in response to a fourth scan signal GS4. In an exemplary embodiment of the preset inventive concept, the seventh transistor T7 may include a gate electrode, a first electrode connected to the initialization voltage VINT, and a second electrode connected to the first electrode of the organic light emitting diode OLED (i.e., the fourth node N4). The gate electrode of the seventh transistor T7 is configured to receive the fourth scan signal GS4 from the $(i-1)^{th}$ inverted scan line /SL(i-1)

The storage capacitor CST may include a first electrode connected to the first power supply voltage ELVDD and a second electrode connected to the gate electrode of the first transistor T1 at the first node N1.

Figure 3:
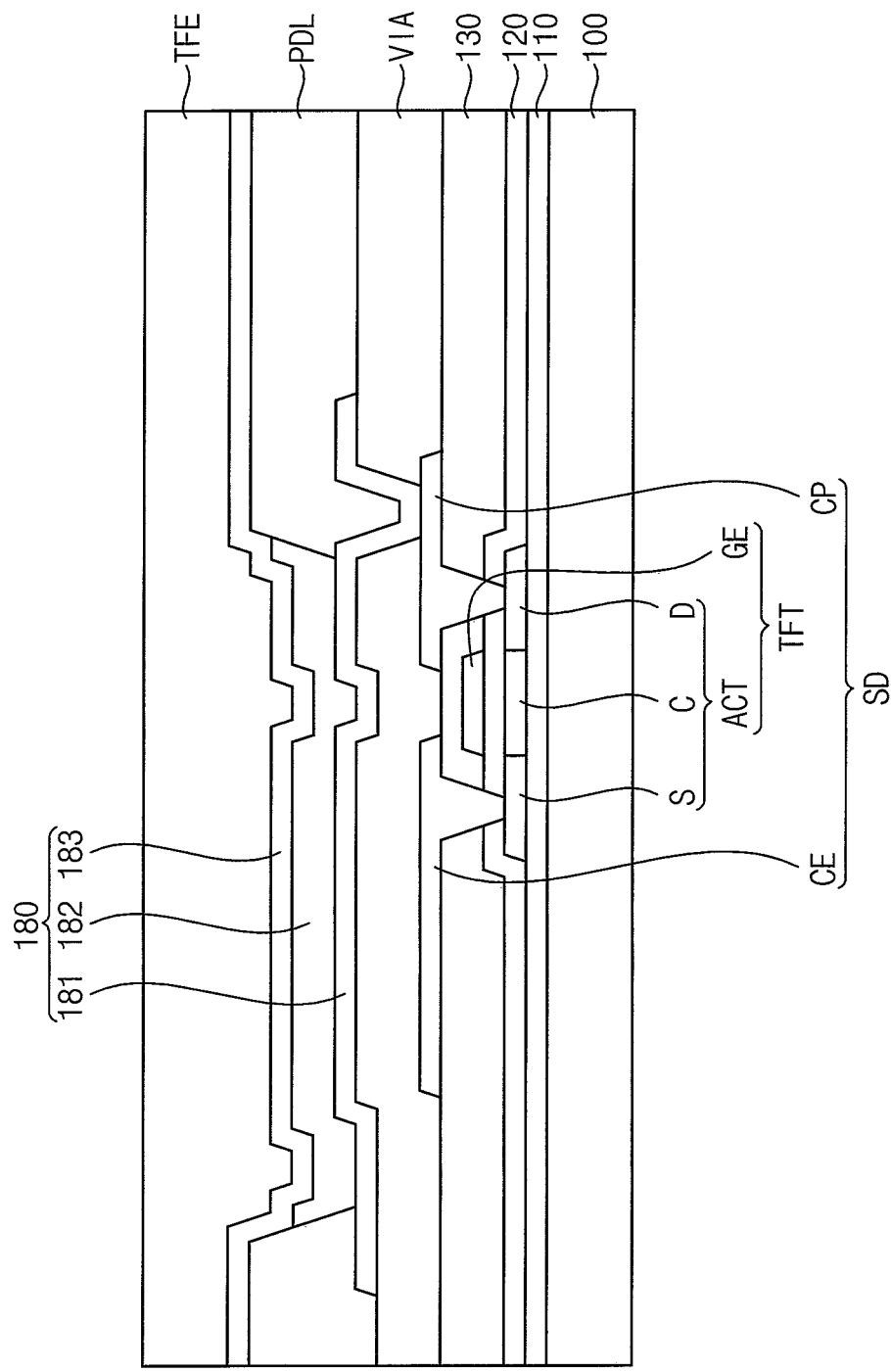
FIG. 3 is a cross-sectional diagram illustrating a display apparatus according to an exemplary embodiment of the present inventive concept.

FIG. 3 is a cross-sectional diagram illustrating a display apparatus according to an exemplary embodiment of the present inventive concept.

Referring to FIG. 3, the display apparatus may include a base substrate 100, a buffer layer 110, an active pattern ACT, a first insulating layer 120, a gate conductive layer, a second insulating layer 130, a source-drain conductive layer, a via insulating layer VIA, a pixel defining layer PDL, a light emitting structure 180, and a thin film encapsulation layer TFE.

The base substrate 100 may be formed of a transparent or opaque material. For example, the base substrate 100 may include a quartz substrate, a synthetic quartz substrate, a calcium fluoride substrate, a fluorine-doped quartz substrate (e.g., an F-doped quartz substrate), a soda lime glass substrate, a non-alkali glass substrate, and the like. In an exemplary embodiment of the present inventive concept, the base substrate 100 may be a transparent resin substrate having flexibility. Examples of the transparent resin substrate that may be used as the base substrate 100 include a polyimide substrate.

The buffer layer 110 may be disposed on the base substrate 100. The buffer layer 110 may prevent metal atoms or impurities from diffusing from the base substrate 100 into the active pattern ACT, and may control a heat transfer rate during a crystallization process for forming the active pattern ACT to obtain a substantially uniform active pattern ACT. In addition, when a surface of the base substrate 100 is not uniform, the buffer layer 110 may serve to increase flatness of the surface of the base substrate 100. For example, the buffer layer 110 may planarize an upper surface of the base substrate 100.

The active pattern ACT of a thin film transistor TFT may be disposed on the buffer layer 110. For example, the active pattern ACT may include poly crystal silicon. The active pattern ACT may include a drain region D and a source region S which are doped with impurities, and a channel region C disposed between the drain region and the source region. For example, the poly crystal silicon may be formed by depositing amorphous silicon and crystallizing the amorphous silicon. In an exemplary embodiment of the present inventive concept, the active pattern ACT may include an oxide semiconductor. For example, the oxide semiconductor may be a semiconductor oxide layer including a binary compound ($AB_x$), a ternary compound ($AB_xC_y$), a quaternary compound ($AB_xC_yD_z$), and the like including tin (Sn), indium (In), zinc (Zn), gallium (Ga), titanium (Ti), aluminum (Al), hafnium (Hf), zirconium (Zr), magnesium (Mg), and the like.

The first insulating layer 120 may be disposed on the active pattern ACT. For example, the first insulating layer 120 may be disposed along a profile of the active pattern ACT with a substantially uniform thickness to cover the active pattern ACT on the buffer layer 110. In addition, the first insulating layer 120 may cover the active pattern ACT on the buffer layer 110, and may have a substantially flat top surface without creating a step around the active pattern ACT. The first insulating layer 120 may include an inorganic insulating material such as a silicon compound and metal oxide.

The gate conductive layer may be disposed on the first insulating layer 120. The gate conductive layer may include a gate electrode GE of the thin film transistor TFT. The gate conductive layer may be formed by using a metal, an alloy, metal nitride, conductive metal oxide, a transparent conductive material, and the like.

The second insulating layer 130 may cover the gate conductive layer on the first insulating layer 120, and may have a substantially flat top surface without creating a step around the gate conductive layer. In addition, the second insulating layer 130 may be disposed along a profile of the gate conductive layer with a substantially uniform thickness to cover the gate conductive layer on the first insulating layer 120. The second insulating layer 130 may include an inorganic insulating material such as a silicon compound and metal oxide.

The source-drain conductive layer may be disposed on the second insulating layer 130. The source-drain conductive layer may include a connection electrode CE and a contact pad CP. The source-drain conductive layer may further include a signal wiring and a voltage wiring such as a data line (see, e.g., DL of FIG. 4) and a power line (see, e.g., PL of FIG. 4). The source-drain conductive layer may be formed by using a metal, an alloy, metal nitride, conductive metal oxide, a transparent conductive material, and the like. The connection electrode CE and the contact pad CP may each respectively contact the source region S and the drain region D through respective contact holes formed in the first insulating layer 120 and the second insulating layer 130.

The via insulating layer VIA may be disposed on the source-drain conductive layer. The via insulating layer VIA may have a single-layer structure, and may also have a multilayer structure including at least two insulating films. The via insulating layer VIA may be formed by using an organic material such as a photoresist, an acryl-based resin, a polyimide-based resin, a polyamide-based resin, and a siloxane-based resin.

The light emitting structure 180 may include a first electrode 181, a light emitting layer 182, and a second electrode 183.

The first electrode 181 may be disposed on the via insulating layer VIA. In addition, the first electrode 181 may be connected to the contact pad CP through a contact hole formed in the via insulating layer VIA. Depending on a light emitting scheme of the display apparatus, the first electrode 181 may be formed by using, for example, a reflective material or a transmissive material. In exemplary embodiment of the present inventive concept, the first electrode 181 may have a single-layer structure or a multilayer structure including, for example, a metal film, an alloy film, a metal nitride film, a conductive metal oxide film, and/or a transparent conductive material film.

The pixel defining layer PDL may be disposed on the via insulating layer VIA on which the first electrode 181 is disposed. The pixel defining layer PDL may be formed by using an organic material, an inorganic material, and the like. For example, the pixel defining layer PDL may be formed by using a photoresist, a polyacryl-based resin, a polyimide-based resin, an acryl-based resin, a silicon compound, and the like. In an exemplary embodiment of the present inventive concept, the pixel defining layer PDL may be etched to form an opening which partially exposes the first electrode 181. An emission area and a non-emission area of the display apparatus may be formed by the opening of the pixel defining layer PDL. For example, the opening of the pixel defining layer PDL may correspond to the emission area, and the non-emission area may correspond to a portion of the pixel defining layer PDL adjacent to the opening of the pixel defining layer PDL.

The light emitting layer 182 may be disposed on the first electrode 181 exposed through the opening of the pixel defining layer PDL. For example, the light emitting layer 182 may be disposed in the opening of the pixel defining layer PDL. In addition, the light emitting layer 182 may extend onto a side wall of the opening of the pixel defining layer PDL. In an exemplary embodiment of the present inventive concept, the light emitting layer 182 may have a multilayer structure including an organic light emitting layer, a hole injection layer, a hole transport layer, an electron transport layer, an electron injection layer, and the like. In an exemplary embodiment of the present inventive concept, except for the organic light emitting layer, the hole injection layer, the hole transport layer, the electron transport layer, the electron injection layer, and the like may be commonly formed to correspond to the plurality of pixels. The organic light emitting layer of the light emitting layer 182 may be formed by using light emitting materials for generating different color lights such as red light, green light, and blue light according to each pixel of the display apparatus (see, e.g., 182a, 182b, and 182c of FIG. 4).

The second electrode 183 may be disposed on the pixel defining layer PDL and the light emitting layer 182. Depending on a light emitting scheme of the display apparatus, the second electrode 183 may include a transmissive material or a reflective material. In an exemplary embodiment of the present inventive concept, the second electrode 183 may have a single-layer structure or a multilayer structure including, for example, a metal film, an alloy film, a metal nitride film, a conductive metal oxide film, and/or a transparent conductive material film.

The thin film encapsulation layer TFE may be disposed on the second electrode 183. The thin film encapsulation layer TFE may prevent moisture and oxygen from penetrating the display apparatus from an outside. The thin film encapsulation layer TFE may include at least one organic layer and at least one inorganic layer. The at least one organic layer and the at least one inorganic layer may be alternately stacked on each other. For example, the thin film encapsulation layer TFE may include two inorganic layers and one organic layer disposed therebetween, but the present inventive concept is not limited thereto. In an exemplary embodiment of the present inventive concept, a sealing substrate may be provided instead of the thin film encapsulation layer to block external air and moisture from penetrating into the display apparatus.

FIG. 4 is a plan diagram illustrating a source-drain conductive layer, a pixel electrode, and a light emitting layer of the display apparatus of FIG. 3. In FIG. 4, the plan view shows an area corresponding to one red sub-pixel (see 182a), one blue sub-pixel (see 182c), and four green sub-pixels (see 182b).

Referring to FIGS. 3 and 4, the source-drain conductive layer may include a data line DL, a power line PL, a contact pad CP, and a connection electrode CE.

The data line DL may extend in a second direction D2. The data line DL may have a substantially straight line shape. In addition, the data line DL may include a curved line portion DLb and a straight line portion DLa connected to the curved line portion DLb. In addition, the data line DL is adjacent to the light emitting layer 182c which is the emission area. For example, the connection between the straight line portion DLa and the curved line portion DLb is adjacent to the light emitting layer 182c.

The power line PL may extend in the second direction D2 while being spaced apart from the first data line DL in a first direction D1. In addition, the power line PL may include a curved line portion PLb and a straight line portion PLa connected to the curved line portion PLb. In addition, the power line PL is adjacent to the light emitting layer 182c which is the emission area. For example, the connection between the straight line portion PLa and the curved line portion PLb is adjacent to the light emitting layer 182c.

The above configuration is to prevent the connection electrode CE from being adjacent to the data line DL or the power line PL without a design margin when the connection electrode CE has annular shape or the like with a size increased in the first direction D substantially perpendicular to the second direction D2.

The red sub-pixel may include a first electrode 181a, a red light emitting layer 182a, and a second electrode 183a. The green sub-pixel may include a first electrode 181b, a green light emitting layer 182b, and a second electrode 183b. The blue sub-pixel may include a first electrode 181c, a blue light emitting layer 182c, and a second electrode 183c.

In the blue sub-pixel, the contact pad CP may be electrically connected to the first electrode 181c through a contact hole formed through the via insulating layer VIA (see, e.g., FIG. 3). The contact pad CP may not overlap the blue light emitting layer 182c disposed in the opening of the pixel defining layer PDL In addition, in the red sub-pixel or the green sub-pixel, contact pads CP corresponding to the respective pixels may be electrically connected to the first electrodes 181a and 181b through contact holes formed through the via insulating layer VIA, respectively. The contact pads may not overlap the red light emitting layer 182a and the green light emitting layer 182b.

The connection electrode CE may overlap the blue light emitting layer 182c. The connection electrode CE may include a first contact portion, a second contact portion spaced apart from the first contact portion in the second direction D2, and a curved wiring portion which connects the first contact portion to the second contact portion. The configuration will be described in detail below with reference to FIGS. 5C and 5D.

The connection electrode CE may be formed to correspond to each of the sub-pixels, and a connection electrode CE which overlaps the blue light emitting layer 182c may include a curved wiring portion. Accordingly, a concavo-convex portion corresponding to the connection electrode CE may be formed on a top surface of the via insulating layer VIA (see, e.g., the top surface of the via insulating layer VIA of FIG. 3). For example, the top surface of the via insulating layer VIA may be uneven and include protrusions and indentations. Since the via insulating layer VIA is not completely planarized, the via insulating layer VIA may have an inclined portion (e.g., concavo-convex portion) along the connection electrode CE which is a wiring disposed under the via insulating layer VIA, and a concavo-convex portion corresponding to the concavo-convex portion of the via insulating layer VIA may be formed on a top surface of the first electrode 181c (see, e.g., the top surface of 181 of FIG. 3).

For example, the connection electrode CE is a portion of the source-drain conductive layer, and the source-drain conductive layer generally extends in the second direction D2, in which a white angular difference (WAD) may vary according to an azimuth angle. For example, a deviation of the WAD may occur when the display apparatus is viewed obliquely from a left or right side of the display apparatus and when the display apparatus is viewed obliquely from an upper or lower side of the display apparatus.

According to the present embodiment, the connection electrode CE includes the curved wiring portion, so that the concavo-convex portion may be formed in a curved line. Accordingly, WAD distribution may be improved, and variations of luminance and color coordinates according to an azimuth angle may be reduced.

Here, the WAD is a factor for evaluating a variation of white light emission characteristics according to an observation angle with respect to an organic light emitting diode display apparatus, and is an index for checking a degree of improvement of a wide viewing angle. For example, referring to the WAD, compared to a case in which the shape structure of the connection electrode according to an exemplary embodiment of the present inventive concept is not applied, a luminance variation and a color coordinate variation according to a variation of the observation angle on the basis of a front side which is perpendicular to a screen of the display apparatus may be reduced, so that display quality may be increased.

Here, as a WAD improvement rate becomes high, there is no great difference in the luminance variation and the color coordinate variation when obliquely viewing the display apparatus from a side of the display apparatus as compared with a case where the display apparatus is viewed from the front side of the display apparatus.

In addition, due to the concavo-convex portion formed on the top surface of the first electrode by the curved wiring portion of the connection electrode CE, variations of luminance and color coordinates according to the azimuth angle may be reduced. In other words, when the display apparatus is viewed obliquely in various directions such as up, down, left, and right directions, the luminance variation and the color coordinate variation according to a variation of an observation azimuth angle may be reduced, so that the display quality may be increased.

In addition, a thickness of the blue light emitting layer 182c may be smaller than a thickness of each of the red light emitting layer 182a and the green light emitting layer 182b. For example, the thickness of the green light emitting layer 182b may be greater than the thickness of the blue light emitting layer 182c, and the thickness of the red light emitting layer 182a may be greater than the thickness of the green light emitting layer 182b. Therefore, the blue light emitting layer 182c having the smallest thickness may have a large WAD or a large deviation according to an azimuth angle due to the concavo-convex portion formed on the top surface of the first electrode, and the WAD or the deviation according to the azimuth angle from being increased due to the curved wiring portion of the connection electrode CE.

FIGS. 5A, 5B, 5C and 5D are plan diagrams illustrating various examples of connection electrodes of a display apparatus according to an exemplary embodiment of the present inventive concept.

Figure 5A:
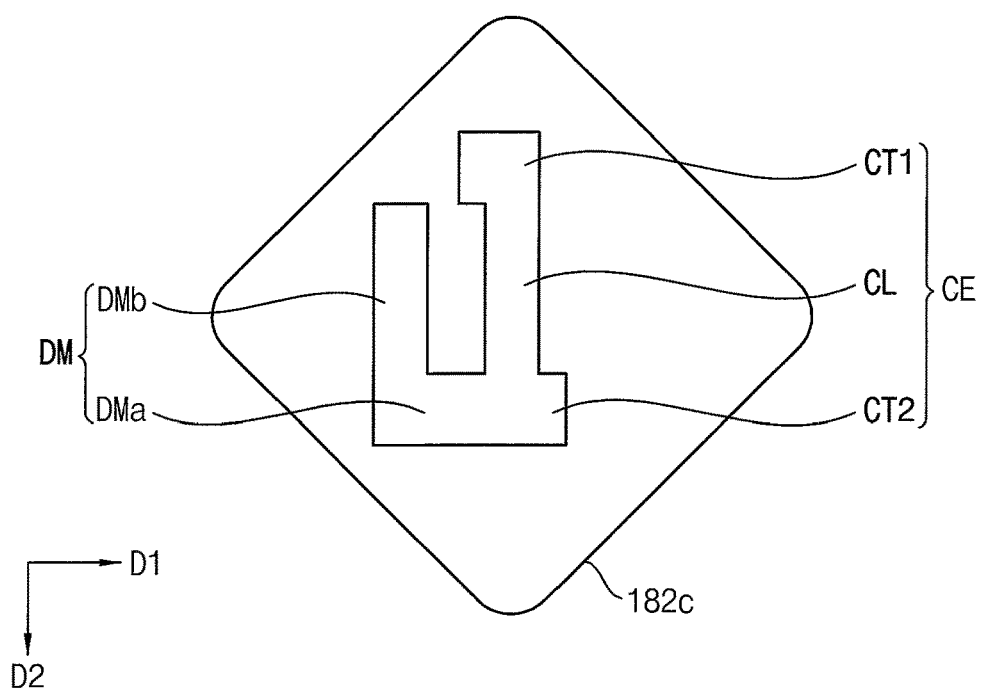
FIGS. 5A, 5B, 5C and 5D are plan diagrams illustrating various examples of connection electrodes of a display apparatus according to an exemplary embodiment of the present inventive concept.

Referring to FIG. 5A, the connection electrode CE may include: a first contact portion CT1; a second contact portion CT2 spaced apart from the first contact portion CT1 in the second direction D2; a connection wiring portion CL which connects the first contact portion CT1 to the second contact portion CT2; and a dummy portion including a horizontal portion DMa extending in the first direction D1 and connected to the second contact portion CT2, and a vertical portion DMb extending in the second direction D2 and connected to the horizontal portion DMa. The dummy portion may overlap the light emitting layer 182c. For example, the light emitting layer 182c may completely overlap the dummy portion.

Similar to the curved wiring portion described in FIG. 4, the dummy portion may form an inclined portion (concavo-convex portion) on the top surface of the first electrode. Accordingly, the WAD and deviations in luminance and color coordinates according to an azimuth angle may be improved.

Figure 5B:
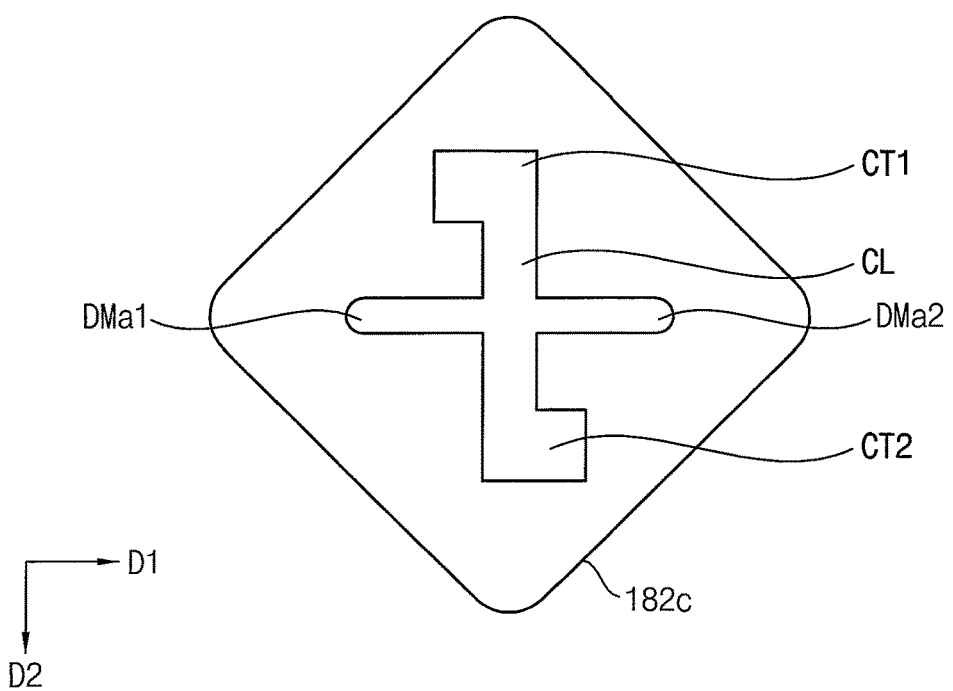

Referring to FIG. 5B, the connection electrode CE may include: a first contact portion CT1; a second contact portion CT2 spaced apart from the first contact portion CT1 in the second direction D2; a connection wiring portion CL which connects the first contact portion CT1 to the second contact portion CT2; and a dummy portion including a first horizontal portion DMa1 and a second horizontal portion DMa2 extending left and right in the first direction D1 from the connection wiring portion CL, respectively. The dummy portion may be electrically connected to the first contact portion CT1, the second contact portion CT2, and the connection portion CL of the connection electrode CE, and may have various shapes in addition to the shapes illustrated in FIGS. 5A and 5B. For example, the dummy portion may have a curved line shape as well as a straight line shape.

Figure 5C:
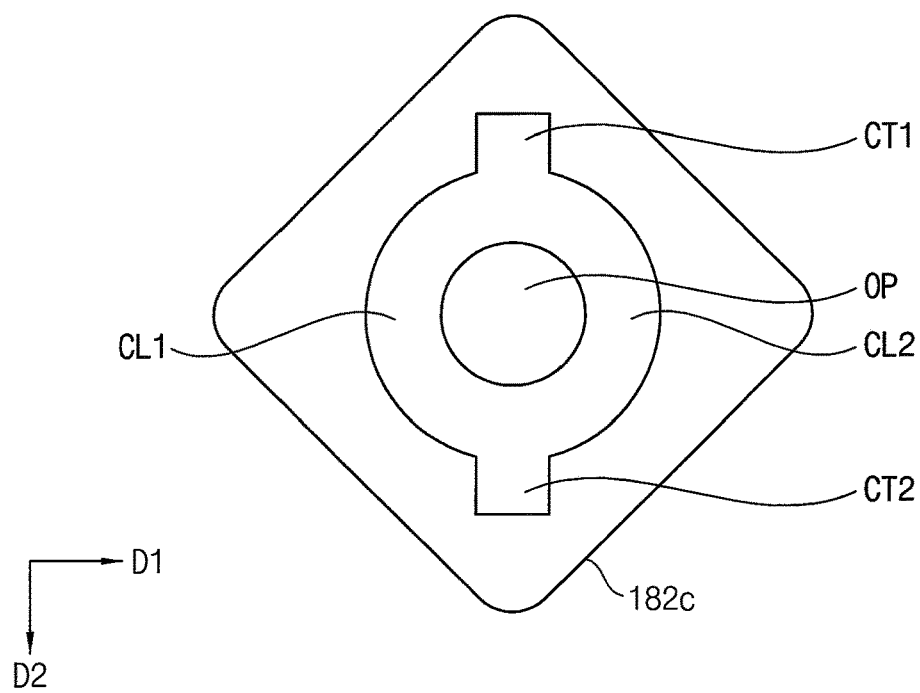

Referring to FIG. 5C, the connection electrode CE may include a first contact portion CT1, a second contact portion CT2 spaced apart from the first contact portion CT1 in the second direction D2, and a first curved wiring portion CL1 and a second curved wiring portion CL2 which connect the first contact portion CT1 to the second contact portion CT2. The first curved wiring portion CL1 and the second curved wiring portion CL2 may have annular shape. The first curved wiring portion CL1 and the second curved wiring portion CL2 having the annular shape may overlap the light emitting layer 182c. For example, the first curved wiring portion CL1 and the second curved wiring portion CL2 may be completely overlapped by the light emitting layer 182c.

Figure 5D:
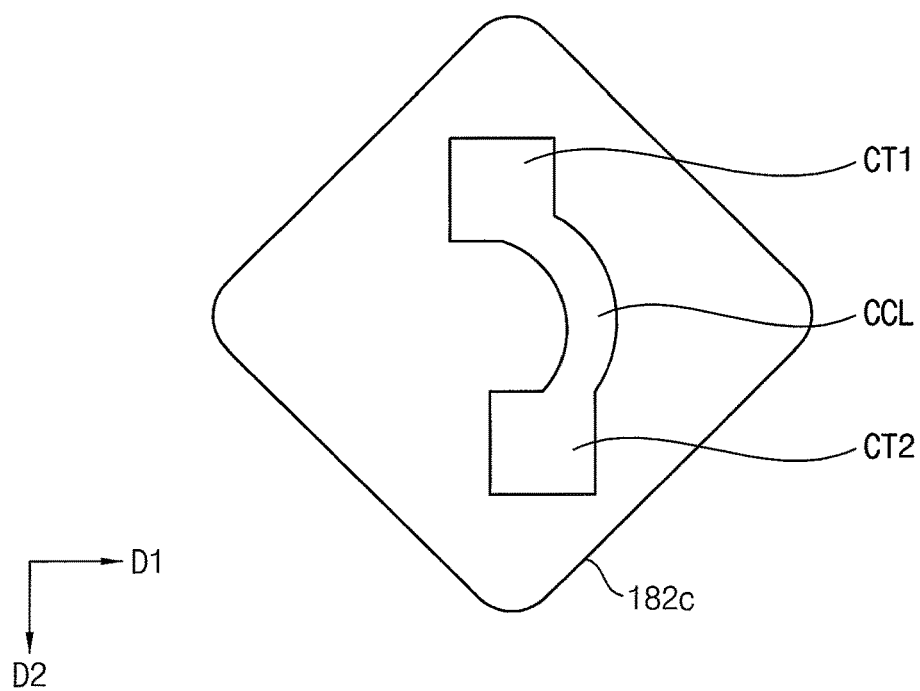

Referring to FIG. 5D, the connection electrode CE may include a first contact portion CT1, a second contact portion CT2 spaced apart from the first contact portion CT1 in the second direction D2, and a curved wiring portion CCL which connects the first contact portion CT1 to the second contact portion CT2. The curved wiring portion CCL may have an arc shape or a curved shape. The curved wiring portion CCL may overlap the light emitting layer 182c. For example, the light emitting layer 182c may completely overlap the curved wiring portion CCL.

Figure 6:
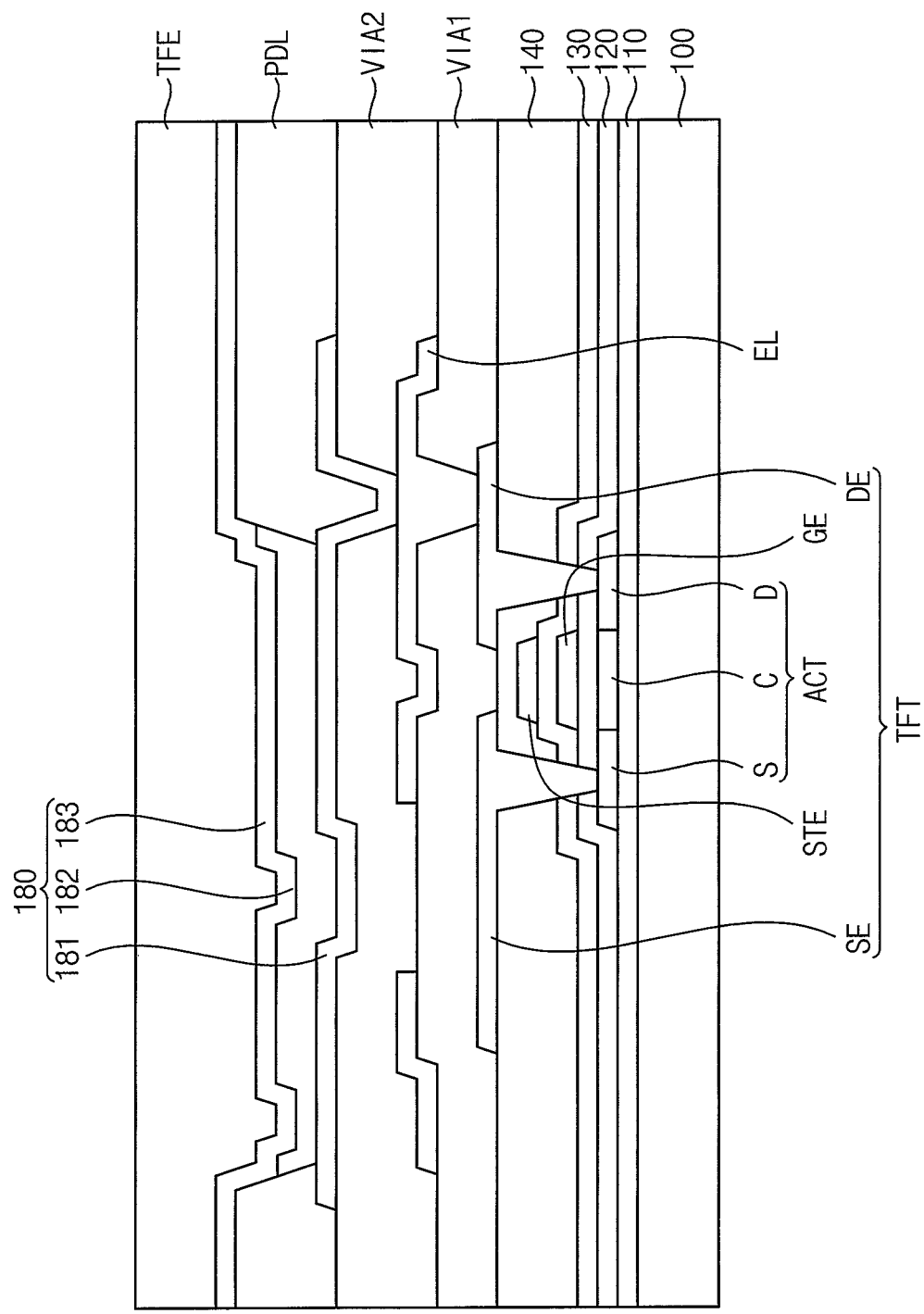
FIG. 6 is a cross-sectional diagram of a display apparatus according to an exemplary embodiment of the present inventive concept.
Figure 7:
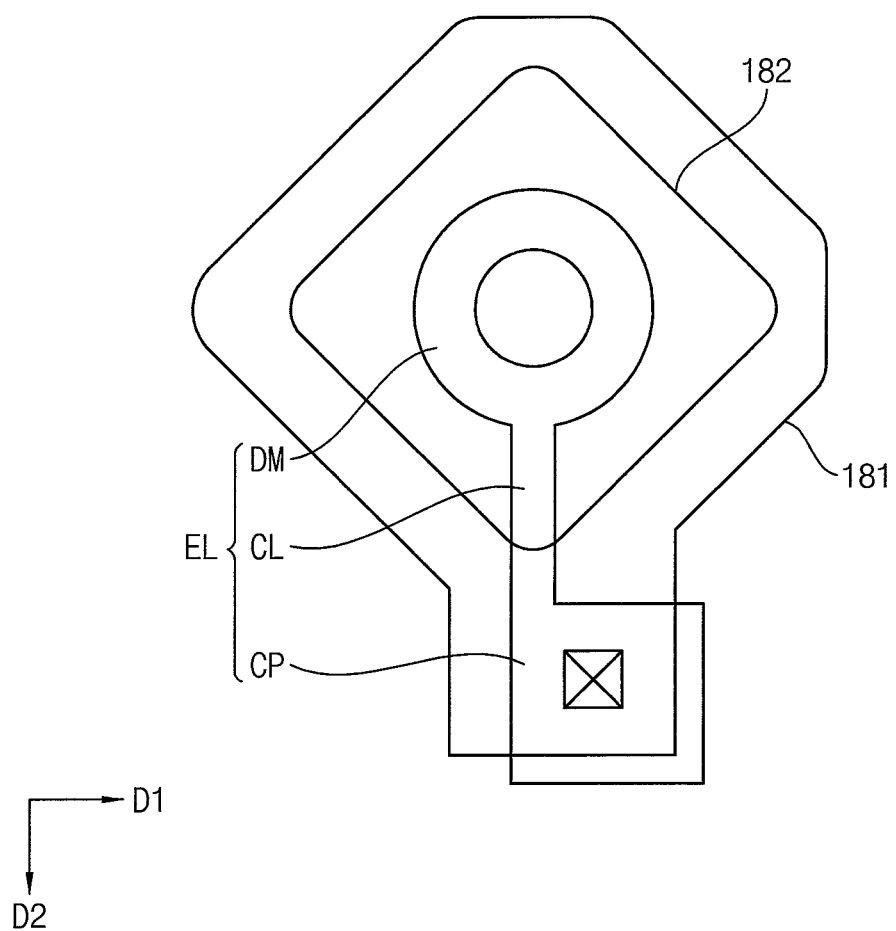
FIG. 7 is a plan diagram illustrating an electrode, a pixel electrode, and a light emitting layer of the display apparatus of FIG. 6.

FIG. 6 is a cross-sectional diagram of a display apparatus according to an exemplary embodiment of the present inventive concept, and FIG. 7 is a plan diagram illustrating an electrode, a pixel electrode, and a light emitting layer of the display apparatus of FIG. 6.

Referring to FIGS. 6 and 7, the display apparatus may include a base substrate 100, a buffer layer 110, an active pattern ACT of a thin film transistor TFT, a first insulating layer 120, a first gate conductive layer, a second insulating layer 130, a second gate conductive layer, a third insulating layer 140, a first source-drain conductive layer, a first via insulating layer VIA1, a second source-drain conductive layer, a second via insulating layer VIA2, a pixel defining layer PDL, a light emitting structure 180, and a thin film encapsulation layer TFE. Components of the display apparatus of FIG. 6 may be substantially the same as the components of the display apparatus of FIGS. 3 and 4, respectively, except that the display apparatus of FIG. 6 further includes the second source-drain conductive layer, Thus, any redundant descriptions thereof may be omitted.

The first gate conductive layer may include a gate electrode GE of the thin film transistor TFT. The second gate conductive layer may include a storage electrode STE which overlaps the gate electrode GE to form a storage capacitor.

The first source-drain conductive layer may include a source electrode SE and a drain electrode DE of the thin film transistor TFT. The second source-drain conductive layer may include an electrode EL. The electrode EL may include a contact portion CP, a dummy curved wiring portion DM spaced apart from the contact portion CP in the second direction D2, and a connection wiring portion CL which connects the dummy curved wiring portion DM to the contact portion CP. The dummy curved wiring portion DM may have a curved line shape, and may have, for example, an annular shape. The dummy curved wiring portion DM may overlap the light emitting layer 182 of the light emitting structure 180. For example, the dummy curved wiring portion DM may be completely overlapped by the light emitting layer 182.

The contact portion CP of the electrode EL may be electrically connected to the first electrode 181 of the light emitting structure 180 through a contact hole formed through the second via insulating layer VIA2. The contact portion CP of the electrode EL may be electrically connected to the thin film transistor TFT through a contact hole formed through the first via insulating layer VIA1.

In an exemplary embodiment of the present inventive concept, the electrode EL may be similar to the connection electrodes in FIGS. 5A-5D. For example, the electrode EL may include a first contact portion, a second contact portion spaced apart from the first contact, and a curved wiring portion connecting the first and second contact portions to each other. For example, the first contact portion or the second contact portion may be connected to the thin film transistor TFT. However, the present inventive concept is not limited thereto. For example, each of the first contact portion and the second contact portion may be electrically connected to a conductive pattern (e.g., the thin film transistor TFT) through a contact hole formed through the first via insulating layer VIA1.

Figure 8:
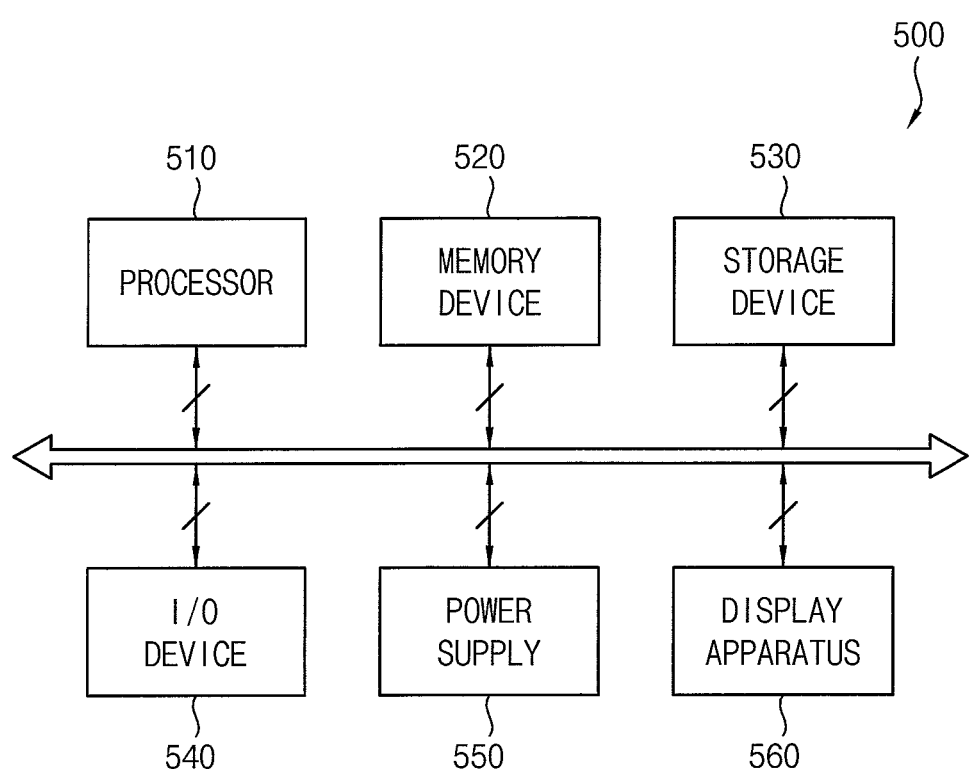
FIG. 8 is a block diagram illustrating an electronic apparatus according to an exemplary embodiment of the present inventive concept.
Figure 9A:
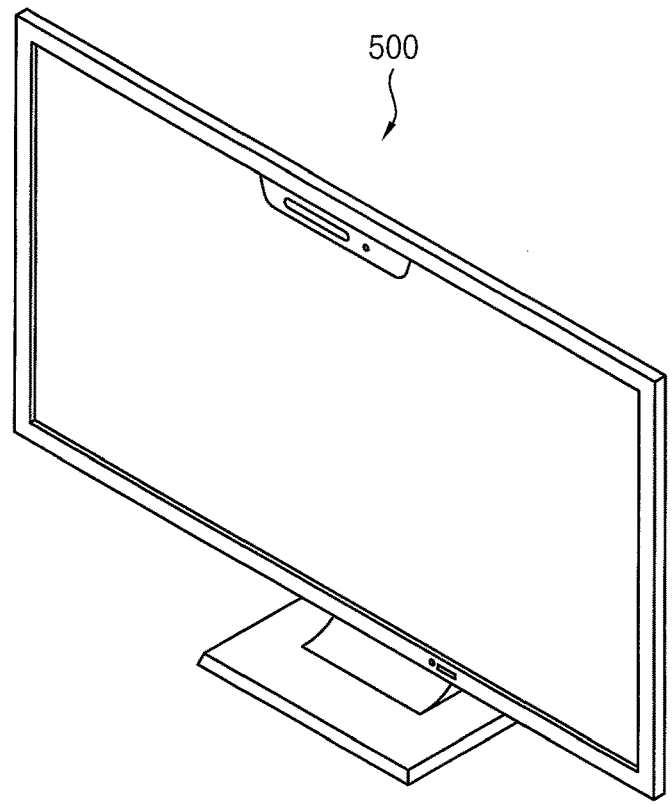
FIG. 9A is a diagram illustrating an example in which the electronic apparatus of FIG. 8 is implemented as a television.
Figure 9B:
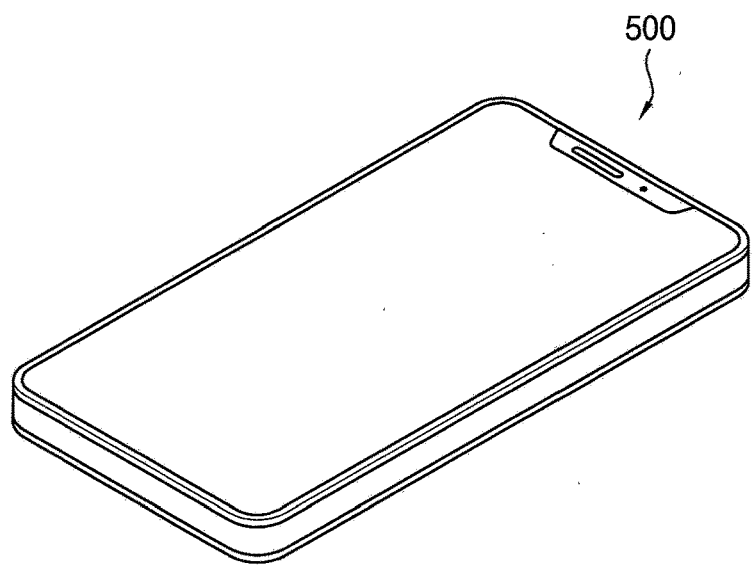
FIG. 9B is a diagram illustrating an example in which the electronic apparatus of FIG. 8 is implemented as a smart phone.

FIG. 8 is a block diagram illustrating an electronic apparatus according to an exemplary embodiment of the present inventive concept, FIG. 9A is a diagram illustrating an example in which the electronic apparatus of FIG. 8 is implemented as a television, and FIG. 9B is a diagram illustrating an example in which the electronic apparatus of FIG. 8 is implemented as a smart phone.

Referring FIGS. 8 and 9, the electronic apparatus 500 may include a processor 510, a memory device 520, a storage device 530, an input/output (I/O) device 540, a power supply 550, and a display apparatus 560. Here, the display apparatus 560 may be the display apparatus of FIG. 1. In addition, the electronic apparatus 500 may further include a plurality of ports for communicating with, for example, a video card, a sound card, a memory card, a universal serial bus (USB) device, other electronic apparatuses, etc. In an exemplary embodiment of the present inventive concept, as illustrated in FIG. 9A, the electronic apparatus 500 may be implemented as a television. In an exemplary embodiment of the present inventive concept, as illustrated in FIG. 9B, the electronic apparatus 500 may be implemented as a smart phone. However, the electronic apparatus 500 is not limited thereto. For example, the electronic apparatus 500 may be implemented as a cellular phone, a video phone, a smart pad, a smart watch, a tablet personal computer (PC), a car navigation system, a computer monitor, a laptop, a head mounted display (HMD) apparatus, etc.

The processor 510 may perform various computing functions. The processor 510 may be a micro processor, a central processing unit (CPU), an application processor (AP), etc. The processor 510 may be coupled to other components via an address bus, a control bus, a data bus, etc. Further, the processor 510 may be coupled to an extended bus such as a peripheral component interconnection (PCI) bus. The memory device 520 may store data for operations of the electronic apparatus 500. For example, the memory device 520 may include at least one non-volatile memory device such as an erasable programmable read-only memory (EPROM) device, an electrically erasable programmable read-only memory (EEPROM) device, a flash memory device, a phase change random access memory (PRAM) device, a resistance random access memory (RRAM) device, a nano floating gate memory (NFGM) device, a polymer random access memory (PoRAM) device, a magnetic random access memory (MRAM) device, a ferroelectric random access memory (FRAM) device, etc. and/or at least one volatile memory device such as a dynamic random access memory (DRAM) device, a static random access memory (SRAM) device, a mobile DRAM device, etc. For example, the storage device 530 may include a solid state drive (SSD) device, a hard disk drive (HDD) device, a CD-ROM device, etc. The I/O device 540 may include an input device such as a keyboard, a keypad, a mouse device, a touch-pad, a touch-screen, etc., and an output device such as a printer, a speaker, etc. The power supply 550 may provide power for operations of the electronic apparatus 500.

The display apparatus 560 may be coupled to other components via the buses or other communication links. In an exemplary embodiment of the present inventive concept, the 1/O device 540 may include the display apparatus 560. As described above, in the display apparatus 560, a connection electrode of a source-drain conductive layer disposed under a light emitting layer of a light emitting structure includes a curved wiring portion or a dummy portion, so that a concavo-convex portion may be formed on a top surface of a first electrode of the light emitting structure. Accordingly, WAD distribution may be improved, and variations of luminance and color coordinates according to an azimuth angle may be reduced. Since these are described above, the duplicated description related thereto will not be repeated.

The present inventive concept may be applied to a display apparatus and an electronic apparatus including the display apparatus. For example, the present inventive concept may be applied to a smart phone, a cellular phone, a video phone, a smart pad, a smart watch, a tablet PC, a car navigation system, a television, a computer monitor, a laptop, a head mounted display apparatus, etc.

While the present inventive concept has been described with reference to exemplary embodiments thereof, it will be understood by those of ordinary skill in the art that various changes in form and details may be made thereto without departing from the spirit and scope of the present inventive concept.

What is claimed is:

1. A display apparatus comprising:
   a base substrate;
   a thin film transistor disposed on the base substrate and including an active pattern;
   an insulating layer disposed on the active pattern of the thin film transistor;
   a connection electrode disposed on the insulating layer, and electrically connected to the thin film transistor, wherein the connection electrode includes a curved wiring portion;
   a first via insulating layer covering the connection electrode;
   a first electrode disposed on the first via insulating layer;
   a light emitting layer disposed on the first electrode and at least partially overlapping the connection electrode; and
   a second electrode disposed on the light emitting layer.

2. The display apparatus of claim 1, further comprising:
   a plurality of data lines arranged along a first direction, wherein each of the data lines extend in a second direction crossing the first direction,
   wherein the connection electrode includes a first contact portion, a second contact portion spaced apart from the first contact portion in the second direction, and the curved wiring portion which connects the first contact portion to the second contact portion.

3. The display apparatus of claim 2, wherein a data line, of the plurality of data lines, adjacent to the connection electrode includes a straight line portion and a curved line portion connected to the straight line portion, wherein the curved line portion is adjacent to the curved wiring portion of the connection electrode.

4. The display apparatus of claim 1, wherein the light emitting layer includes a blue light emitting layer configured to emit blue light.

5. The display apparatus of claim 4, further comprising:
   a red light emitting layer spaced apart from the blue light emitting layer and configured to emit red light; and
   a green light emitting layer spaced apart from the blue light emitting layer and the red light emitting layer and configured to emit green light,
   wherein a thickness of the blue light emitting layer is smaller than a thickness of each of the red and green light emitting layers.

6. The display apparatus of claim 1, further comprising:
   a plurality of power lines arranged along a first direction, wherein each of the power lines extend in a second direction crossing the first direction,
   wherein the connection electrode includes a first contact portion, a second contact portion spaced apart from the first contact portion in the second direction, and the curved wiring portion which connects the first contact portion to the second contact portion, and
   wherein a power line, of the plurality of power lines, adjacent to the connection electrode includes a straight line portion and a curved line portion connected to the straight line portion, wherein the curved line portion is adjacent to the curved wiring portion of the connection electrode.

7. The display apparatus of claim 1, wherein the connection electrode includes a first contact portion, a second contact portion spaced apart from the first contact portion, and the curved wiring portion connecting the first contact portion to the second contact portion, and
wherein the curved wiring portion has an annular shape.

8. The display apparatus of claim 7, Wherein the curved wiring portion overlaps the light emitting layer.

9. The display apparatus of claim 1, wherein the connection electrode includes a first contact portion, a second contact portion spaced apart from the first contact portion, and the curved wiring portion connecting the first contact portion to the second contact portion, and
wherein the curved wiring portion has a curved shape.

10. The display apparatus of claim 1, further comprising:
source and drain electrodes disposed between the base substrate and the connection electrode; and
a second via insulating layer disposed between the source and drain electrodes and the connection electrode,
wherein the connection electrode is electrically connected to the drain electrode through a contact hole formed through the second via insulating layer.

11. The display apparatus of claim 10, Wherein the connection electrode includes a contact portion and the curved wiring portion connected to the contact portion, and
wherein the contact portion of the connection electrode is electrically connected to the first electrode through a contact hole formed through the first via insulating layer.

12. The display apparatus of claim 11, wherein the curved wiring portion of the connection electrode has an annular shape, and
wherein the curved wiring portion overlaps the light emitting layer.

13. The display apparatus of claim 11, wherein the curved wiring portion of the connection electrode has a curved shape, and
wherein the curved wiring portion overlaps the light emitting layer.

14. The display apparatus of claim 10, wherein the connection electrode includes a first contact portion, a second contact portion spaced apart from the first contact portion, and the curved wiring portion which connects the first contact portion to the second contact portion, and
wherein each of the first contact portion and the second contact portion is electrically connected to a conductive pattern of another layer through a contact hole formed through the second via insulating layer.

15. The display apparatus of claim 1, wherein a concavo-convex portion corresponding to the connection electrode is formed on a top surface of the first via insulating layer.

16. The display apparatus of claim 15, wherein a concavo-convex portion corresponding to the concavo-convex portion of the first via insulating layer is formed on a top surface of the first electrode.

17. A display apparatus comprising:
a base substrate;
a thin film transistor disposed on the base substrate and including an active pattern;
an insulating layer disposed on the active pattern of the thin film transistor;
a connection electrode disposed on the insulating layer, and electrically connected to the thin film transistor, wherein the connection electrode includes a dummy portion including a horizontal portion extending in a first direction;
a via insulating layer covering the connection electrode;
a first electrode disposed on the via insulating layer;
a light emitting layer disposed on the first electrode and overlapping the dummy portion of the connection electrode; and
a second electrode disposed on the light emitting layer.

18. The display apparatus of claim 17, wherein the dummy portion further includes a vertical portion extending in a second direction substantially perpendicular to the first direction.

19. The display apparatus of claim 17, wherein the connection electrode further includes a first contact portion, a second contact portion spaced apart from the first contact portion in a second direction, and a connection wiring portion connecting the first contact portion to the second contact portion, and wherein the dummy portion extends from the first contact portion, the second contact portion, or the connection wiring portion, and
wherein the dummy portion overlaps the light emitting layer.

20. The display apparatus of claim 17, wherein the light emitting layer is a blue light emitting layer configured to emit blue light,
wherein the display apparatus further comprises:
a red light emitting layer spaced apart from the blue light emitting layer and configured to emit red light; and
a green light emitting layer spaced apart from the blue light emitting layer and the red light emitting layer and configured to emit green light, and
wherein a thickness of the blue light emitting layer is smaller than a thickness of each of the red and green light emitting layers.

* * * * *